United States Patent [19]

Abdoo

[11] Patent Number: 5,050,170
[45] Date of Patent: Sep. 17, 1991

[54] APPARATUS FOR COMBINING SIGNALS FROM FIRST AND SECOND INFORMATION PROCESSING ELEMENTS

[75] Inventor: David G. Abdoo, Simi Valley, Calif.

[73] Assignee: Schlumberger Technologies, Inc., San Jose, Calif.

[21] Appl. No.: 93,840

[22] Filed: Sep. 4, 1987

Related U.S. Application Data

[63] Continuation of Ser. No. 903,820, Sep. 4, 1986, abandoned.

[51] Int. Cl.[5] .............................................. G01R 31/28
[52] U.S. Cl. ............................................ 371/27; 371/1
[58] Field of Search ............................ 371/1, 21, 27; 324/73 R, 73 AT

[56] References Cited

U.S. PATENT DOCUMENTS

| | | | |
|---|---|---|---|
| 4,497,056 | 1/1985 | Sugamori | 371/25 |
| 4,550,405 | 10/1985 | West | 371/1 |
| 4,586,181 | 4/1986 | Shimizu | 371/27 |
| 4,635,256 | 1/1987 | Herlein | 371/1 |
| 4,737,971 | 4/1988 | Lanzafame et al. | 371/1 |

Primary Examiner—Charles E. Atkinson
Attorney, Agent, or Firm—Townsend and Townsend

[57] ABSTRACT

A formatter for combining timing signals with data from an algorithmic pattern generator (APG). In the disclosed embodiment, the formatter receives address signals from an APG and timing signals from a timing unit. Each timing signal from the timing unit corresponds to an address signal received from the APG. The address and timing signals are communicated to a signal select unit wherein each timing signal selects its corresponding APG address signal. The selected APG address signal then is communicated to a signal combining unit which combines the APG address with its corresponding timing signal and generates leading edge and trailing edge marker pulses having a user-specified pulse width.

13 Claims, 6 Drawing Sheets

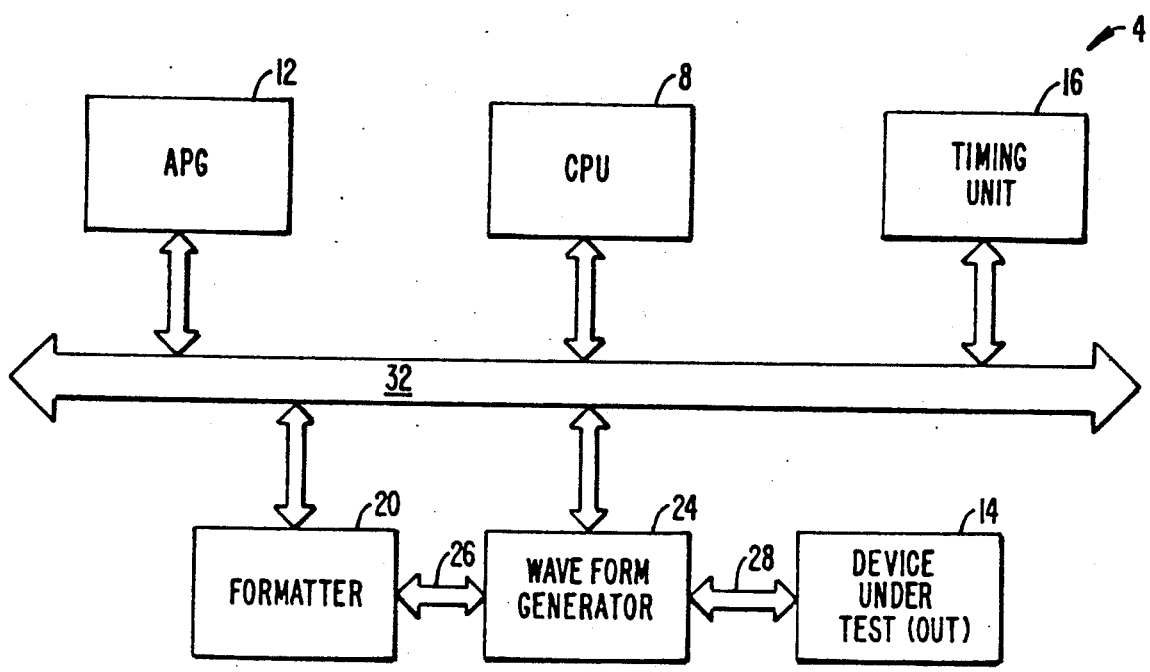
FIG._1.
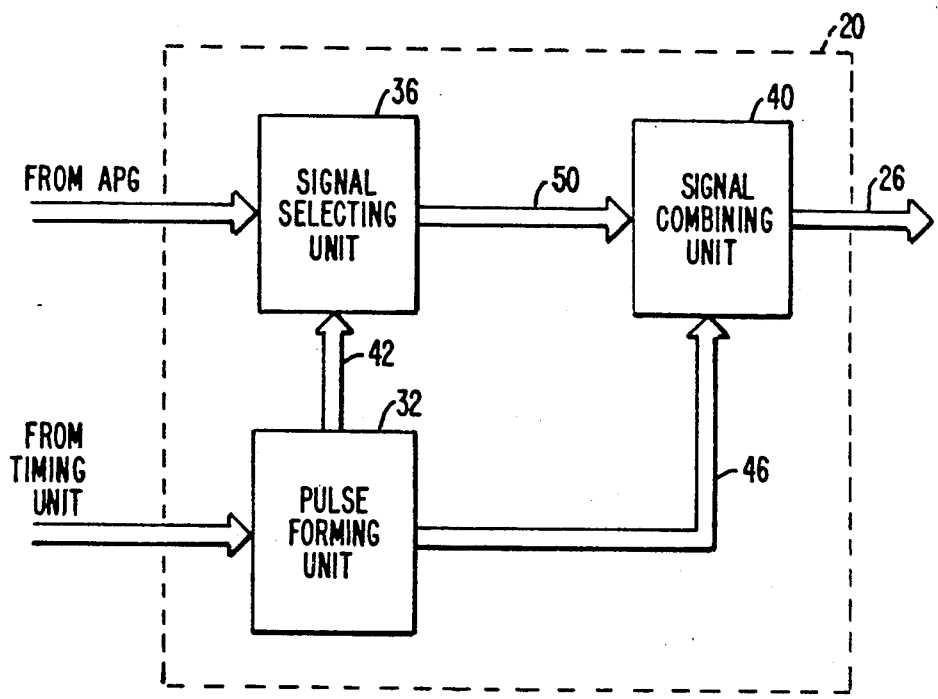
FIG._2.

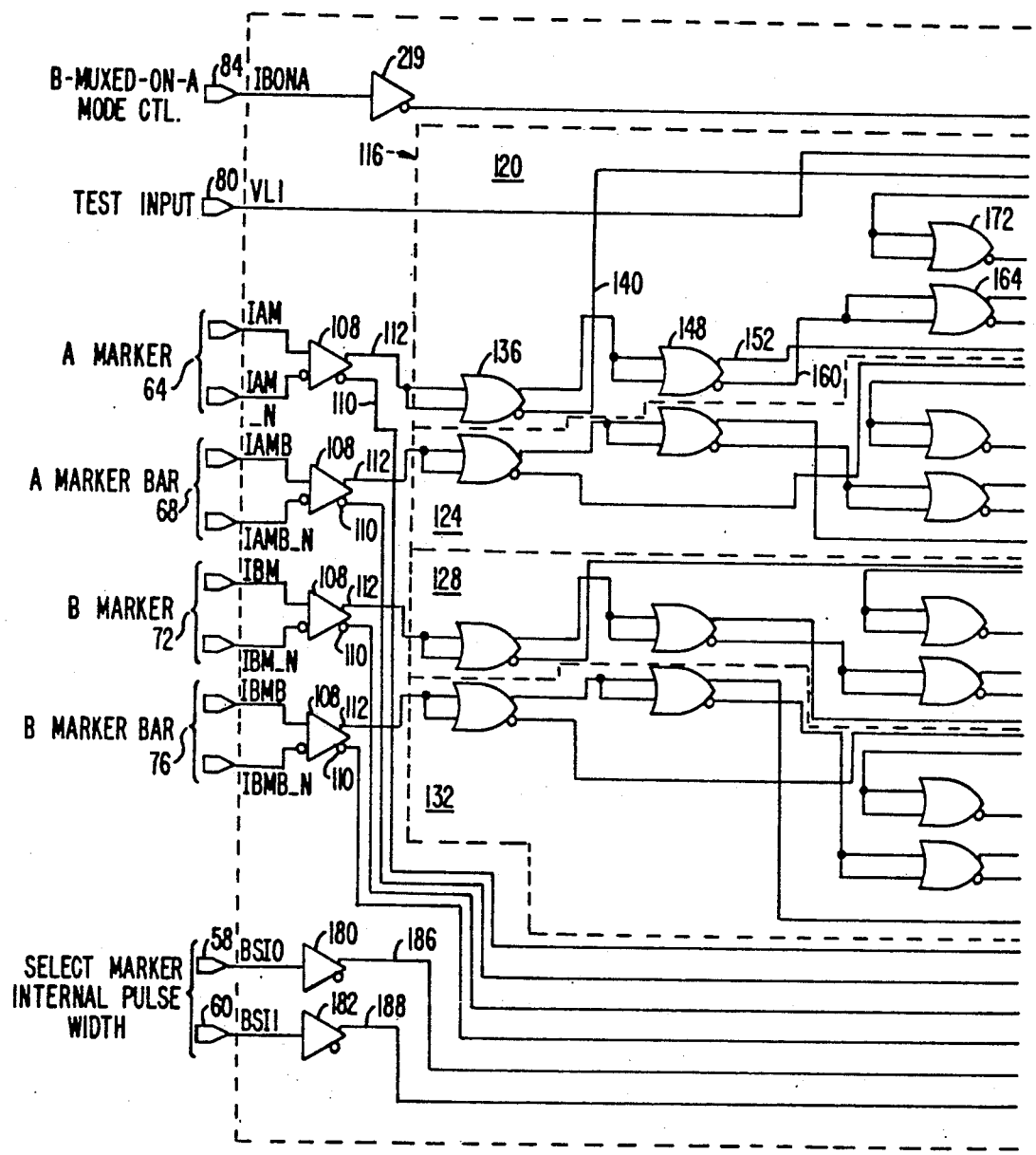
FIG._3.
FIG._3A.

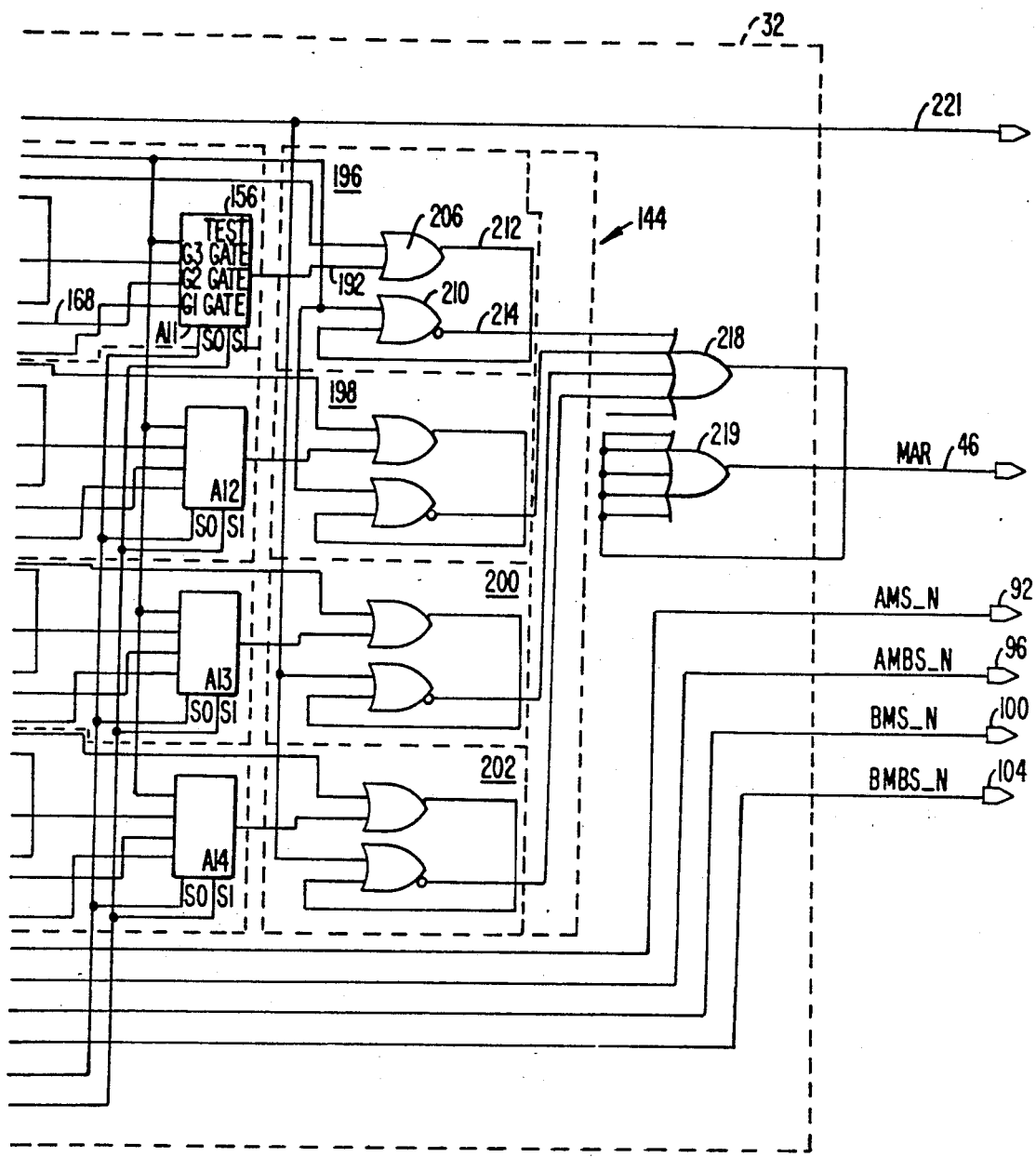
FIG._3B.
PULSE FORMING UNIT

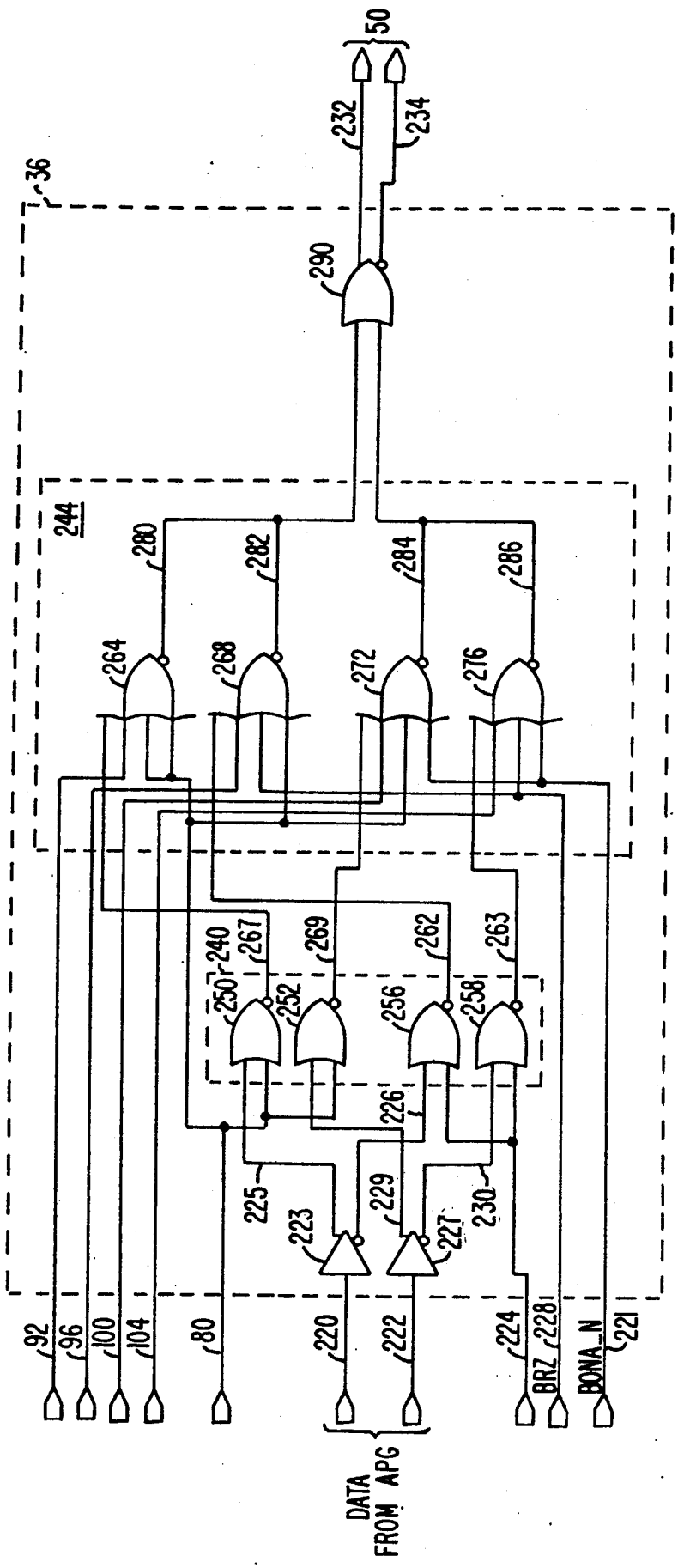
FIG._4.

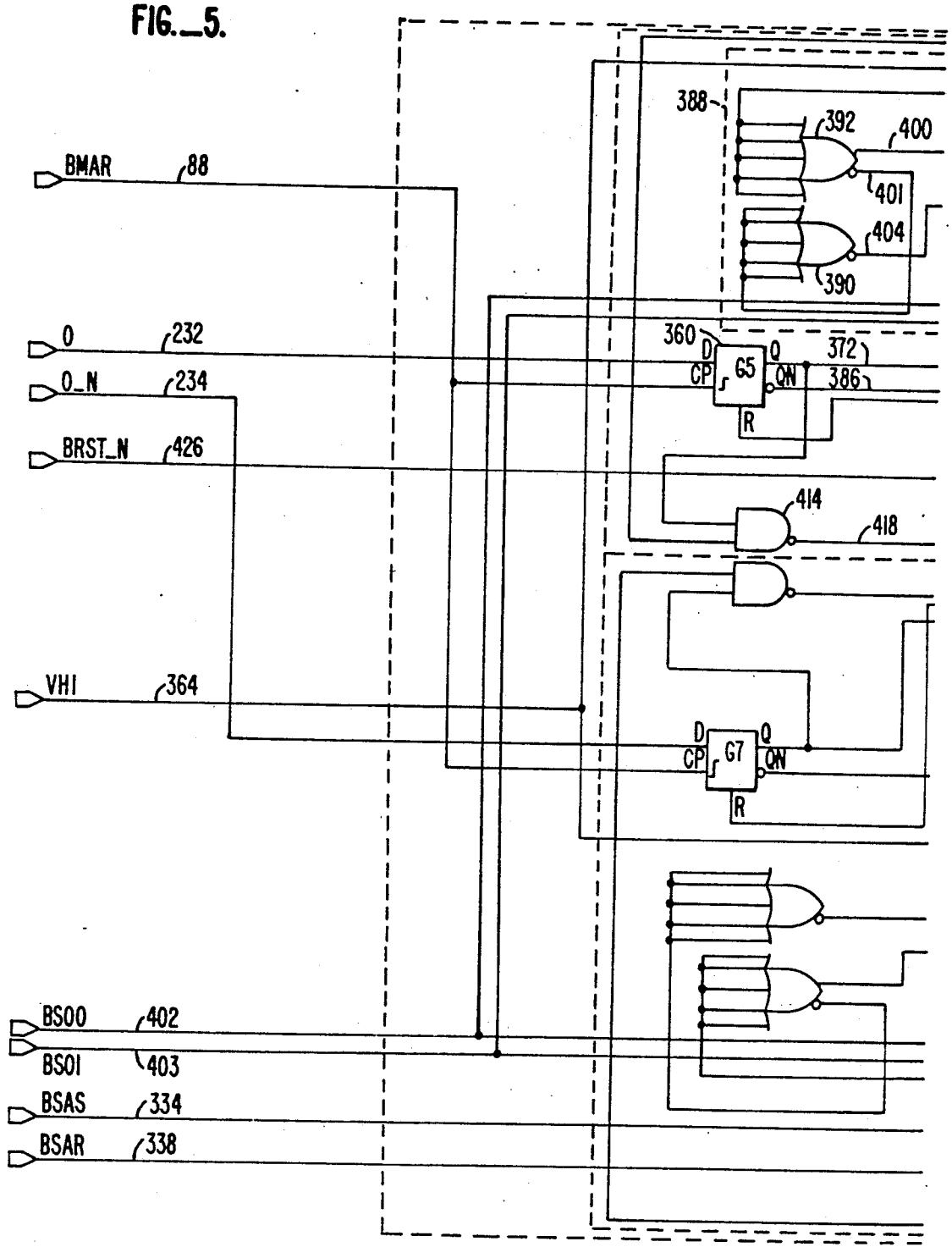
FIG._5A.

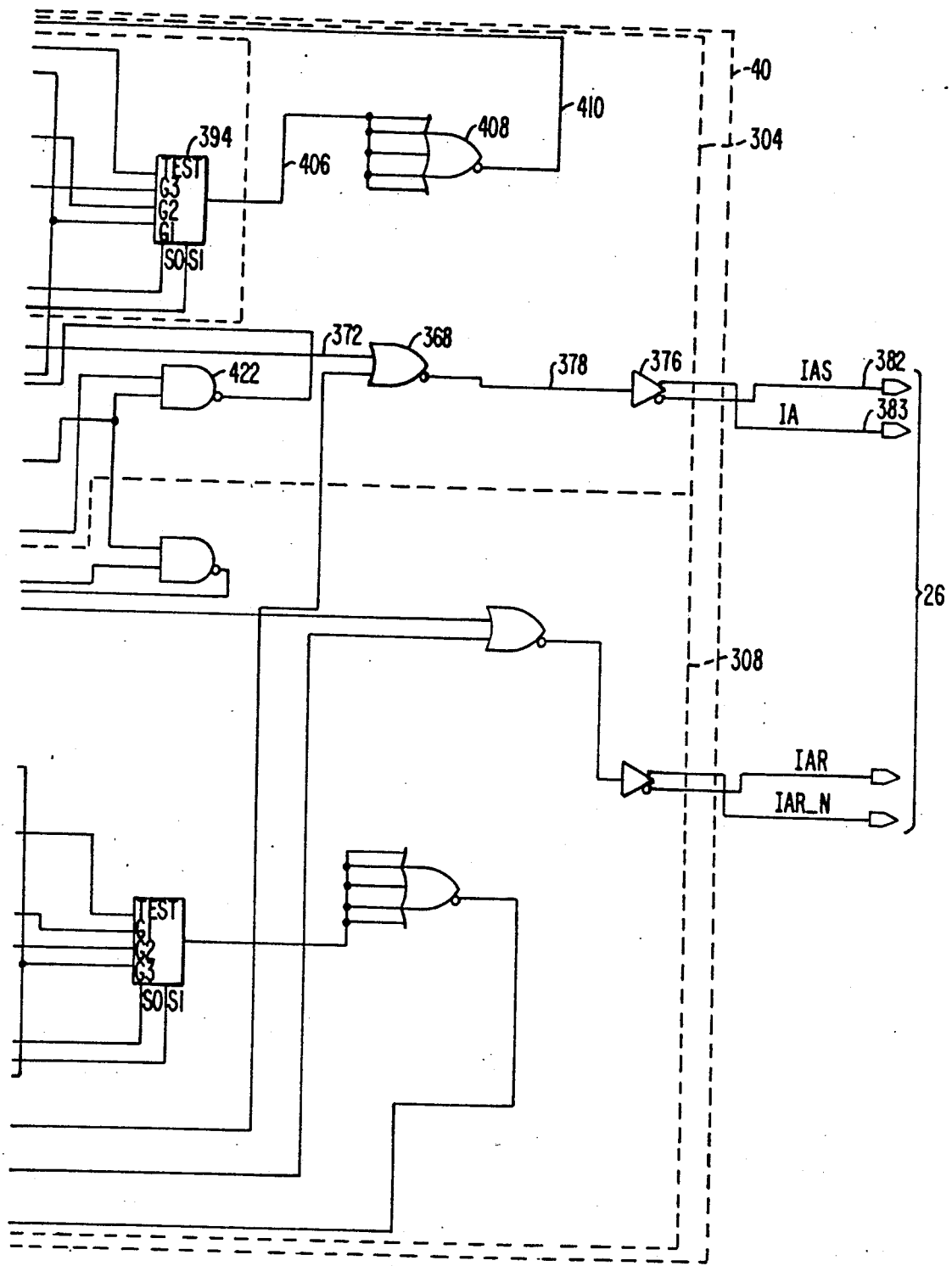
FIG._5B.
SIGNAL COMBINING UNIT

APPARATUS FOR COMBINING SIGNALS FROM FIRST AND SECOND INFORMATION PROCESSING ELEMENTS

This application is a continuation of application Ser. No. 06/903,820, filed Sept. 4, 1986, now abandoned.

BACKGROUND OF THE INVENTION

1. Field of the Invention

This invention relates to electronic testing systems and, more particularly, to a formatter for combining timing signals with data from an algorithmic pattern generator in a memory test system.

2. Description of the Relevant Art

Memory test systems are known. Typically, such systems provide a prescribed electrical signal, e.g., a voltage waveform, to prescribed memory locations for a prescribed length of time. The test waveform ordinarily is generated by combining pattern data from an algorithmic pattern generator (APG) with timing signals from a timing unit. The test waveform then is transmitted to the test head (i.e., drivers) connected to a device under test.

As memory size increases and access time decreases, the ability to generate high-speed test pattern waveforms becomes critical. For example, megabit static rams having access times of 10 to 20 nanoseconds are not uncommon, and the available access time must be used in order to test such memories in a timely and cost-effective manner. Unfortunately, signal propagation through the test system causes waveform skew, and this frequently renders the test waveform unusable by the device under test unless the waveform is properly deskewed. This is especially the case when generating test waveforms having such high speed timing noted above. When deskewing waveforms, each voltage transition (e.g., leading and trailing edges of a pulse) must be deskewed separately, and that is difficult, if not impossible, to do at high frequencies.

SUMMARY OF THE INVENTION

The present invention is directed to a formatter for a memory test system wherein test pattern data (address or data) from an algorithmic pattern generator (APG) are combined with timing signals from a timing unit so that the combined signals are distributed to a test head as leading edge and trailing edge formatted marker signals, rather than as formatted pulses in an actual test waveform. At the test head, the marker signals may be combined in a gate array so that a test waveform having extremely narrow pulses may be transmitted to a device under test (DUT). A waveform generated in this manner has excellent pulse width signal fidelity with a minimum of cross-talk. The formatted markers may be generated in return-to-zero or return-to-one formats, and in address/data and mixed address/data access modes.

In one embodiment of the present invention illustrated by an address formatter, the formatter receives address signals from an APG and timing signals from a timing unit. Each timing signal from the timing unit corresponds to an address signal received from the APG. The address and timing signals are communicated to a signal select unit wherein each timing signal selects its corresponding APG address signal. The selected APG address signal then is communicated to a signal combining unit which combines the APG address signal with its corresponding timing signal.

Before the timing signals are combined with their corresponding APG address signals, the timing signals are processed by a pulse forming unit which routes the plurality of timing signals to a single point and then generates very narrow width pulses from the timing signals. Since the plurality of timing signals are routed to a single point before being combined with the APG signals, the number of deskew elements required, if any, is minimized. Additionally, the leading edge of a pulse emitted from the pulse forming unit occurs after the onset of the APG address signal to ensure that the timing signal pulses occur within the address pulse interval. The combined signals have a very narrow user defined pulse width so that they may be processed by the test head as leading edge and trailing edge marker signals. As a result, the marker signals are easily deskewed, and they can support very high frequency test patterns.

These and other advantages of the invention will become apparent to those skilled in the art upon reading the following detailed description of the invention, which should be taken in conjunction with the accompanying drawings.

BRIEF DESCRIPTION OF THE DRAWINGS

FIG. 1 is a block diagram of an embodiment of a memory test system according to the present invention.

FIG. 2 is a block diagram of the formatter according to the invention shown in FIG. 1.

FIG. 3 is a diagram showing the layout of FIGS. 3A and 3B.

FIG. 3A and 3B are schematic diagrams of the pulse forming unit according to the invention shown in FIG. 2.

FIG. 4 is a schematic diagram of a signal select unit according to the present invention shown in FIG. 2.

FIG. 5 is a diagram showing the layout of FIGS. 5A and 5B.

FIGS. 5A and 5B are a schematic diagram of a signal combining unit according to the invention shown in FIG. 2.

DETAILED DESCRIPTION OF THE PREFERRED EMBODIMENTS

FIG. 1 is a block diagram of a memory test system 4 according to the present invention. As shown in FIG. 1, memory test system 4 comprises a CPU 8 for controlling the operation of memory test system 4, an algorithmic pattern generator (APG) 12 for generating test signals used for creating test patterns (checkerboard/sliding diagonal, etc.) for exercising a device under test (DUT) 14, and a timing unit 16 for generating a plurality of timing signals. A formatter 20 receives the test signals from APG 12 and the timing signals from timing unit 16 and combines the signals to generate a formatted-marker signal. A waveform generator 24 receives the formatted marker signals from formatter 20 over a formatter-generator bus 26 and produces a formatted waveform on a generator-DUT bus 28 to exercise DUT 14. CPU 8, APG 12, timing unit 16, formatter 20, and waveform generator 24 communicate among themselves through a system bus 32.

FIG. 2 is a block diagram of formatter 20 illustrated in FIG. 1. As shown in FIG. 2, formatter 20 comprises a pulse forming unit 32, a signal selecting unit 36, and a signal combining unit 40. Pulse forming unit 32 forms very narrow pulses from timing signals received from timing unit 16. Pulse forming unit 32 communicates the received timing signals to signal selecting unit 36 over a forming-selecting bus 42, and it communicates the very narrow pulses to signal combining unit 40 over a forming-combining bus 46. Signal selecting unit 36 selects test signals from APG 12 in response to the timing signals received from pulse forming unit 32. The selected APG test signals then are communicated to signal combining unit 40 over a selecting-combining bus 50. Signal combining unit 40 receives the selected APG test signals from signal selecting unit 36 and the narrow timing pulses from pulse forming unit 32, combines the signals, and communicates the combined signals as formatted marker signals to waveform generator 24 (FIG. 1) over formatter-generator bus 26.

FIGS. 3A and 3B are schematic diagrams of an address forming portion of pulse forming unit 32 shown in FIG. 2. As shown in FIGS. 3A, and 3B pulse forming unit 32 comprises A-marker differential input lines 64, A-Marker-Bar differential input lines 68, B-Marker differential input lines 72, and B-Marker-Bar differential input lines 76 for receiving timing signals from timing unit 25. Pulse width control input lines 58 and 60 receive signals from CPU 8 for controlling the width of pulses formed by pulse forming unit 32. A test input line 80 receives signals from CPU 8 for causing the output of pulse forming unit 32 to be in a predetermined state, and an address mode control line 84 receives signals from CPU 8 for allowing pulse forming unit 32 to operate in an address multiplexing mode.

Pulse forming unit 32 further comprises an address multiplexing line 221 for emitting address mode control signals and a timing pulse output line 88 for emitting the modified timing signals used by signal combining unit 40. Timing pulse output line 88 generally comprises forming-combining bus 46. An A-Marker select line 92, an A-Marker-Bar select line 96, a B-Marker select line 100, and a B-Marker-Bar select line 104 emit select signals used by signal selecting unit 36. The signals appearing on select lines 92-104 are low true. Address multiplexing line 221 and select lines 92-104 comprise forming-selecting bus 42.

The signals appearing on timing signal input lines 64, 68, 72, and 76 are received by corresponding timing signal input buffers 108, each of which has an inverting output terminal 110 and a non-inverting output terminal 112. The signals, appearing on inverting output terminals 110 are communicated to select lines 92, 96, 100, and 104. The signals appearing on non-inverting output terminals 112 are communicated to a timing signal delay circuit 116 comprising an A-Marker delay circuit 120, an A-Marker-Bar delay circuit 124, a B-Marker delay circuit 128, and a B-Marker-Bar delay circuit 132. Delay circuit 116 determines the width of the pulses appearing on timing pulse output line 88. The construction and operation of each circuit are the same, so only A-Marker delay circuit 120 shall be described in detail.

An A-Marker signal on line 112 is communicated to the input terminals of an OR/NOR gate 136. The inverting output terminal of OR/NOR gate 136 is connected to a line 140 which, in turn, is coupled to a pulse forming circuit 144. Pulse forming circuit 144 forms the actual pulses which are communicated to timing pulse output line 88. The non-inverting output terminal of OR/NOR gate 136 is connected to the input terminals of an OR/NOR gate 148. The non-inverting output terminal of OR/NOR gate 148 is connected to a line 152 which, in turn, is connected to a G1 input terminal of a multiplexer 156. The inverting output terminal of OR/NOR gate 148 is connected to a line 160 which, in turn, is connected to the input terminals of an OR/NOR gate 164. The inverting output terminal of OR/NOR gate 164 is connected to a line 168 which, in turn, is connected to a G2 input terminal of multiplexer 156. The non-inverting output terminal of OR/NOR gate 164 is connected to the input terminals of a NOR gate 172. The output terminal of NOR gate 172 is connected to a line 176 which, in turn, is connected to a G3 input terminal of multiplexer 156.

The output terminal of multiplexer 156 is connected to pulse forming circuit 144. Multiplexer 156 is used for selecting a desired delay of the output signal from OR/NOR gate 136 to pulse forming circuit 144. The signal at the G1 input terminal of multiplexer 156 represents a one-gate delay of the output signals from OR/NOR gate 136, the signal at the G2 input terminal of multiplexer 156 represents a two-gate delay of the output signals from OR/NOR gate 136, and the signal at the G3 input terminal of multiplexer 156 represents a three-gate delay of the output signals from OR/NOR gate 136. The test input signals at the test input terminal of multiplexer 156 are used to override the operation of delay circuit 116 in a test mode. The desired delay may be selected by the signals applied to pulse width control lines 58 and 60. The pulse width control signals are communicated to the S0 and S1 input terminals of multiplexer 156 through buffers 180 and 182 and lines 186 and 188, respectively.

Pulse forming circuit 144 comprises an A-Marker pulse circuit 196, an A-Marker-Bar pulse circuit 198, a B-Marker pulse circuit 200, and a B-Marker-Bar pulse circuit 202. The construction and operation of each pulse circuit 196, 198, 200, and 202 are the same, except as noted below, so only A-Marker pulse circuit 196 shall be described in detail. A-Marker pulse circuit 196 comprises an OR gate 206 and a NOR gate 210. One input terminal of OR gate 206 is connected to line 140 for receiving the inverted output signals of OR/NOR gate 136. The other input terminal of OR gate 206 is connected to line 192 for receiving the output signals from multiplexer 156. The output terminal of OR gate 206 is connected to a line 212 which, in turn, is connected to an input terminal of NOR gate 210. The other input terminal of NOR gate 210 is connected for receiving signals from test input line 80. The output terminal of NOR gate 210 is connected to a line 214, which, in turn, is connected to an input terminal of an OR gate 218. The output terminal of OR gate 218 is connected to the input terminals of an OR gate 219, the output terminal of OR gate 219 is connected to timing pulse output line 88.

In operation, a logic high A-Marker input timing signal causes a low signal to appear at the inverting output terminal of OR/NOR gate 136 in marker delay circuit 116. The low signal is communicated through line 140 to OR gate 206 in pulse forming circuit 144 for causing a low signal to appear on line 212. The low signal on line 212, in turn, appears as a high signal on line 214. Pulses appearing on line 214 are communicated to OR gate 218 and appear as high true signals on timing pulse output line 88. A logic high signal from the non-inverting output terminal of OR/NOR gate 136 appears at the other input terminal of OR gate 206 after the amount of delay selected by multiplexer 156. Since the output signals from multiplexer 156 are high true, a high signal appears on line 212, causing the output signal on line 214 from NOR gate 210 to go low. Thus, the delay selected in A-marker delay circuit 120 determines the width of the timing pulses emitted on timing pulse output line 88. Typically, the width of the timing pulses is short enough to fit within the time interval of the APG signals. Approximately 1.5 nanoseconds is a desirable pulse width value, and the programmability of multiplexer 156 guarantees that this value may be achieved over the entire delay spread of the circuit. In test mode, a high signal is applied to test input line 80 for disabling A-Marker delay circuit 120 and for immediately generating a manually controlled pulse on marker output line 88.

The construction and operation of B-Marker pulse circuit 200 and B-Marker-Bar pulse circuit 202 are the same as A-Marker pulse circuit 196 and A-Marker-Bar pulse circuit 198, except that signals received from address mode control line 84 are substituted for signals received from test input line 80. Accordingly, when a low signal is applied to address mode control line 84, a high signal appears at the output terminal of a buffer 219 and on address multiplixing line 221 for disabling both B-Marker pulse circuit 200 and B-Marker-Bar pulse circuit 202, so that signals applied to B-Marker input line 72 and B-Marker-Bar input line 76 do not affect the output of the circuit. When a high signal is applied to address mode control line 84, signals appearing on B-Marker line 72 and B-Marker-Bar line 76 are allowed to affect the output of the circuit as well. The address multiplexing mode is used when testing DRAMS where the X and Y addresses are multiplexed.

FIG. 4 is a schematic diagram of signal selecting unit 36 shown in FIG. 2. As shown in FIG. 4, signal selecting unit 36 has as inputs A-Marker select line 92. A-Marker-Bar select line 96. B-Marker select line 100, and B-Marker-Bar select line 104 from pulse forming unit 32. Signal selecting unit 36 also receives address multiplexing signals on line 221 for placing formatter 20 in address multiplexing mode. Test input signals are received from CPU 8 on test input line 80. Address data are received from APG 12 on an X-address input line 220 and on a Y-address input line 222. X-input line 220 is connected to a buffer 223 for producing a non-inverted X-address signal on an X-address line 225 and an inverted X-address signal on an X-Bar address line 226. Similarly. Y-input line 222 is connected to a buffer 227 for producing a non-inverted Y-address signal on a Y-address line 229 and an inverted Y-address signal on a Y-Bar address line 230.

Signal select unit 36 receives signals on an RO line 224 for placing formatter 20 in a return-to-one mode. Signal select unit 36 also receives a signal on an RZ line 228 for placing formatter 20 in a return-to-zero mode. For communicating the selected signals to signal combining unit 40, signal select unit 36 has a non-inverted selected test signal line 232 and an inverted selected test signal line 234. Lines 232 and 234 form selecting-combining bus 50.

Signal selecting unit 36 comprises an RO mode circuit 240 for placing formatter 20 in return-to-one mode and a select/RZ mode circuit 244. Select/RZ mode circuit 244 is for placing formatter 20 in a return-to-zero mode and for selecting the signals from address lines 225, 226, 229, and 230 based on the signals appearing on select lines 92, 96, 100, and 104, respectively. RO mode circuit 240 comprises NOR gates 250, 252, 256, and 258. NOR gate 250 has an input terminal connected to X-address line 225, and NOR gate 252 has an input terminal connected to Y-address line 229. The other input terminals of NOR gates 250 and 252 are connected for receiving test signals on test input line 80. When not in a test mode, the signals appearing on lines 267 and 269, connected to the output terminals of NOR gates 250 and 252, respectively, are inverted versions of the signals appearing on lines 225 and 229. When a high signal appears on test input line 80, a low signal appears on lines 267 and 269, irrespective of the signals appearing on lines 225 and 229.

NOR gate 256 has an input terminal connected to X-Bar address line 226 for receiving X-Bar address signals, and NOR gate 258 has an input terminal connected to Y-Bar address line 230 for receiving Y-Bar address signals. The other input terminals to NOR gates 256 and 258 are connected to RO line 224 for receiving signals for placing formatter 20 in a return-to-one mode. When a high signal appears on RO line 224, a low signal appears on lines 262 and 263, connected to the output terminals of NOR gates 256 and 258, respectively, regardless of the signals appearing on X-bar address line 226 and Y-Bar address line 230. On the other hand, when a low signal appears on RO line 224, lines 262 and 263 propagate inverted forms of the signals appearing on X-bar address line 226 and Y-Bar address line 230 to select/RZ mode circuit 244.

Select/RZ mode circuit 244 selects either the X-address signals appearing on line 267, the Y-address signals appearing on line 269, the X-Bar address signals appearing on line 262, or the Y-Bar address signals appearing on line 263 based on the signals appearing on select lines 92, 96, 100, and 104, respectively. Additionally, Select/RZ mode circuit 244 places formatter 20 in a return-to-zero mode when a high signal appears on RZ line 228. Select/RZ mode circuit 244 comprises NOR gates 264, 268, 272, and 276. NOR gate 264 has its input terminals connected for receiving X-address signals on line 267, A-Marker select signals on line 92, and test signals on test input line 80. NOR gate 268 has its input terminals connected for receiving X-Bar address signals on line 262, A-Marker-Bar select signals on line 96, test signals on test input line 80 and RZ signals on RZ line 228. NOR gate 272 has its input terminals connected for receiving Y-address signals on line 269, B-Marker select signals on line 100, test signals on test input line 80 and address multiplexing signals on address multiplexing line 221. NOR gate 276 has its input terminals connected for receiving Y-Bar address signals on line 263. B-Marker-Bar select signals on line 104, RZ signals on line 228 and address multiplexing signals on address multiplexing line 221. NOR gates 264, 268, 272, and 276 have their output terminals connected to lines 280, 282, 284, and 286, respectively, for emitting the selected X-address. X-Bar address, Y-address, and Y-Bar address signals.

When a low signal appears on RZ line 228, lines 282 and 286 propagate inverted forms of the selected X-bar address and Y-Bar address signals appearing on lines 262 and 263. On the other hand, when a high signal appears on RZ line 228, a low signal appears on lines 282 and 286, regardless of the signals appearing on lines 262 and 263. NOR gates 264 and 272 are similarly enabled and disabled by the signals appearing on test input line 80. NOR gates 272 and 276 are enabled and disabled by the signals appearing on address multiplexing line 221 so that, when a high signal appears on line 221, the Y-address signals appearing on line 269 and the Y-Bar address signals appearing on line 263 do not affect the output of the circuit. The signals appearing on lines 280, 282, 284, and 286 are communicated to the input terminals of an OR/NOR gate 290 for emitting a non-inverted selected address signal on selected test signal line 232 and an inverted selected address signal on selected test signal-Bar line 234.

In short, an A-Marker select. A-Marker-Bar select, B-Marker select, or B-Marker-Bar select signal on select lines 92, 96, 100, or 104 selects a signal on X-address, X-Bar address, Y-address, or Y-Bar address lines 225, 226, 229, or 230, respectively, and the selected signal appears on selecting-combining bus 50. Whether the output signals are in return-to-zero or return-to-one mode depends upon the signals applied to RZ line 228 and RO line 224. When in test mode, the signals appearing on selecting-combining bus 50 reflect the signals appearing on test input line 80.

FIGS. 5A and 5B are schematic diagrams of signal combining unit 40 shown in FIG. 2. Signal combining unit 40 combines the narrow pulses on timing pulse output line 88 from pulse forming unit 32 with the signals on selected test signal line 232 and selected test signal-Bar line 234 from signal select unit 36. Because of the delay inherent in pulse forming unit 32, the leading edge of each timing pulse received on line 88 occurs after the beginning of the selected test signals received on lines 232 and 234 to ensure accurate signal matching. Signal combining unit 40 generates leading edge and trailing edge marker signals, respectively, having a user-set narrow pulse width on combining-generating bus 26.

As shown in FIGS. 5A and 5B signal combining unit 40 comprises a leading edge pulse circuit 304 and a trailing edge pulse circuit 308. The construction and operation of leading edge pulse circuit 304 and trailing edge pulse circuit 308 are the same, so only the details of leading edge pulse circuit 304 shall be described. The signals on timing pulse output line 88 (forming-combining bus 46) from pulse forming unit 32 are coupled to the clock input terminal of a D-type flip-flop 360. The D input terminal of flip-flop 360 is connected for receiving signals from selected test signal line 232. Flip flop 360 functions to combine the signals appearing on timing pulse output line 88 with the signals appearing on selected test signal line 232 and to produce a combined signal at a Q output terminal. The Q output terminal of flip-flop 360 is connected to an input terminal of a NOR gate 368 through a line 372. The other input terminal of NOR gate 368 is connected for receiving signals from a leading edge test line 334. The output terminal of NOR gate 368 is connected to a buffer 376 through a line 378. The inverting output terminal of buffer 376 is connected to a leading edge output line 382, and the non-inverting output terminal of buffer 376 is connected to a leading edge output-bar line 383. Accordingly, a leading edge and leading edge-bar signal appear on lines 382 and 383, respectively, when flip-flop 360 receives a signal over timing pulse output line 88.

The Q-Bar output terminal of flip-flop 360 is connected to a line 386, which, in turn, is connected to a leading edge reset timing circuit 388. Leading edge reset timing circuit 388 determines when flip-flop 360 is to be reset, and hence it determines the pulse-width of the leading edge pulses emitted on lines 382 and 383. Leading edge reset timing circuit 388 comprises a NOR gate 390, an OR/NOR gate 392 and a multiplexer 394. Line 386 is connected to a G1 input terminal of multiplexer 394 and to the input terminals of OR/NOR gate 392. The non-inverting output terminal of OR/NOR gate 392 is connected to a line 400, which, in turn, is connected to a G2 input terminal of multiplexer 394. The inverting output terminal of OR/NOR gate 392 is connected to the input terminals of NOR gate 390 through a line 401. The output terminal of OR/NOR gate 390 is connected to the G3 input terminal of multiplexer 394 through a line 404.

Multiplexer 394 has select input terminals S0 and S1 connected to pulse width select lines 402 and 403. Multiplexer 394 selects the amount of gate delay before the signal originally appearing on the Q-bar output terminal of flip-flop 360 appears on a multiplexer output line 406. Multiplexer output line 406 is connected to the input terminals of a NOR gate 408. The output terminal of NOR gate 408 is connected to a line 410, which, in turn, is connected to an input terminal of a NAND gate 414. The other input terminal of NAND gate 414 is connected to the Q output terminal of flip-flop 360. The output terminal of NAND gate 414 is connected to a line 418 which, in turn, is connected to an input terminal of a NAND gate 422. The other input terminal of NAND gate 422 is connected for receiving signals from a master reset line 426. The output terminal of NAND gate 422 is connected to a line 426 which, in turn, is connected to the reset terminal of flip-flop 360. Thus, the signal appearing on the Q-bar output terminal of flip-flop 360 propagates through reset timing circuit 388, and, after the time delay selected by multiplexer 394, the Q-Bar signal appears at the reset terminal of flip-flop 360. Flip-flop 360 resets, and the net result is a leading edge marker pulse having the user set pulse width appearing on leading edge output lines 382 and 383. The resetting of flip-flop 360 may be selectively controlled by master reset line 364 in a test mode.

While the above is a complete description of a preferred embodiment of the present invention, various modifications may be employed. For example, the invention may be employed in other test systems or electrical devices. Additionally, formatter 20 may be constructed without the components which serve testing functions. Consequently, the scope of the invention should not be limited except as properly described in the claims.

What is claimed is:

1. A circuit for combining signals from first and second information processing elements comprising:

first input means for receiving a first signal from the first information processing element;

second input means for receiving a second signal from the second information processing element;

pulse forming means, coupled to the second input means, for generating a first pulse in response to the second signal; and pulse output means, coupled to the first input means and to the pulse forming means, for emitting a second pulse when a first signal is received from the first input means and the first pulse is received from the pulse forming means.

2. The circuit according to claim 1 wherein the first input means further comprises:

selecting means, coupled to the pulse forming means and to the pulse output means, for selecting a first signal in response to the second signal and for emitting the selected first signal to the pulse output means.

3. The circuit according to claim 2 wherein the selected first signal is emitted from the selecting means for a prescribed time interval and the first pulse is emitted from the pulse forming means within the time interval.

4. The circuit according to claim 3 wherein a leading edge of the first pulse emitted from the pulse forming means occurs after the beginning of the time interval.

5. The circuit according to claim 4 wherein a time interval of the first pulse emitted from the pulse forming means is shorter than a time interval of the selected first signal.

6. The circuit according to claim 5 wherein the selected first signal is emitted to the pulse output means for a prescribed time interval, the time interval of the selected first signal being greater than the time interval of the first pulse emitted from the pulse forming means.

7. The circuit according to claim 6 wherein the pulse forming means further comprises means for selectively varying the width of the first pulse emitted therefrom.

8. The circuit according to claim 6 wherein the pulse forming means further comprises:
   first path means for communicating a first signal portion of the second signal along a first path;
   second path means for communicating a second signal portion of the second signal along a second path;
   delay means, coupled to the second path means, for delaying the communication of the second signal portion along the second path; and
   first pulse emitting means, coupled to the first path means and to the second path means, for receiving the first and second signal portions and for forming the first pulse, the width of the first pulse being a function of the time the first signal portion is received and the time the second signal portion is received.

9. The circuit according to claim 8 wherein the delay means further comprises means for selectively varying the amount by which the second signal portion is delayed for selectively varying the width of the first pulse emitted from the pulse forming means.

10. The circuit according to claim 6 wherein the pulse output means comprises:
    pulse combining means for receiving the selected first signal and the first pulse and for emitting a combined signal in response thereto; and
    second pulse generating means, coupled to the pulse combining means, for generating the second pulse in response to the combined signal.

11. The circuit according to claim 10 wherein the second pulse generating means further comprises:
    leading edge generating means for generating a leading edge signal for the second pulse; and
    trailing edge generating means, coupled to the leading edge generating means, for generating a trailing edge signal for the second pulse in response to the leading edge signal.

12. The circuit according to claim 11 wherein the second pulse generating means further comprises:
    leading edge delay means, disposed between the leading edge generating means and the trailing edge generating means, for delaying the leading edge signal being communicated to the trailing edge generating means by a prescribed amount.

13. The apparatus according to claim 12 wherein the leading edge delay means further comprises means for selectively varying the amount by which the leading edge signal is delayed.

* * * * *